United States Patent
Kobayashi et al.

(10) Patent No.: US 6,628,067 B2
(45) Date of Patent: Sep. 30, 2003

(54) ORGANIC ELECTROLUMINESCENT WHITE LIGHT SOURCE AND METHOD FOR MANUFACTURING THE SAME

(75) Inventors: Hidekazu Kobayashi, Nagano-ken (JP); Osamu Yokoyama, Shiojiri (JP); Satoru Miyashita, Chino (JP)

(73) Assignee: Seiko Epson Corporation, Tokyo (JP)

(*) Notice: Subject to any disclaimer, the term of this patent is extended or adjusted under 35 U.S.C. 154(b) by 65 days.

(21) Appl. No.: 09/790,549

(22) Filed: Feb. 23, 2001

(65) Prior Publication Data

US 2001/0022496 A1 Sep. 20, 2001

(30) Foreign Application Priority Data

Feb. 25, 2000 (JP) ........................ 2000-050160
Jan. 29, 2001 (JP) ........................ 2001-020698

(51) Int. Cl.[7] ............................. H01N 1/62
(52) U.S. Cl. ............................ 313/504; 313/506
(58) Field of Search ................ 313/504, 506, 313/503

(56) References Cited

U.S. PATENT DOCUMENTS 6,008,578 A * 12/1999 Chen .................... 313/506
6,091,382 A * 7/2000 Shioya et al. ............ 345/76
6,117,529 A * 9/2000 Leising et al. .......... 428/209
6,344,712 B1 * 2/2002 Eida et al. .............. 313/504
6,384,541 B1 * 5/2002 Ohnishi et al. ......... 315/169.3
6,545,408 B2 * 4/2003 Uchida et al. ........... 313/504
6,552,488 B1 * 4/2003 Roitman et al. ......... 313/512

FOREIGN PATENT DOCUMENTS

JP    A-3-187192    8/1991    ......... H05B/33/14
JP    A-10-39791    2/1998    ......... H05B/33/14

* cited by examiner

Primary Examiner—Sandra O'Shea
Assistant Examiner—Peter Macchiarolo
(74) Attorney, Agent, or Firm—Oliff & Berridge

(57) ABSTRACT

A white backlight is provided by mixing a plurality of luminous lights with balanced white light, while minimizing power consumption and reducing manufacturing cost. Luminous regions are finely arranged in order to uniformly mix a plurality of luminous colors. A white light is obtained by simultaneously lighting luminous colors in the plurality of luminous regions using a single power source. The shape of the luminous regions is determined for depositing the luminous layers.

18 Claims, 13 Drawing Sheets

ORGANIC ELECTROLUMINESCENT WHITE LIGHT SOURCE AND METHOD FOR MANUFACTURING THE SAME

BACKGROUND OF THE INVENTION

1. Field of Invention

The present invention relates to an organic electroluminescent white light source and a method for manufacturing the same. In particular, the present invention relates to an organic electroluminescent white light source useful for a backlight of a liquid crystal display device to be used for a computer display, portable terminal and portable phone, and a method for manufacturing the same.

2. Description of Related Art

Cold-cathode tubes and inorganic LEDs are used for the backlight of the liquid crystal display device to be used for the computer display, portable terminal and portable phone. In conjunction with the recent trend of miniaturization and low power consumption of the computer, portable terminal and portable phone, developments of thinner and low power-consuming white backlight sources are desired.

Developments of thin-type organic electroluminescence (abbreviated as EL hereinafter) elements that consume a small power have been also aggressively developed in recent years. Particularly, the elements that emit blue, green, yellow and orange colors have been extensively investigated, and their luminance and service life have reached a practical level. Luminance and service life of a white organic EL element manufactured by a vacuum deposition method have been also improved.

Application of these organic EL elements to the white backlight have been also aggressively studied. Japanese Unexamined Patent Application Publication No. 3-187192 discloses an invention in which organic EL elements are arranged as a mosaic pattern corresponding to color pixels on the liquid display device. Japanese Unexamined Patent Application Publication No. 10-39791 discloses an invention in which the pixel area ratio among the red, blue and green colors is controlled for white balance using the same addressing voltage among the color pixels in the organic EL display device.

SUMMARY OF THE INVENTION

A special material should be used in luminous layers manufactured by the conventional method for obtaining a white color in the organic EL element, in addition to difficult problems for manufacturing the luminous layers. Sufficient characteristics have not been realized in the organic EL elements of the type requiring to form the white luminous layers by coating polymer materials.

Accordingly, one object of the present invention is to at least provide a structure that allows a balanced white color to be readily obtained by either a vacuum deposition method or a coating method, and a method for manufacturing the same.

One exemplary embodiment of the present invention provides an organic EL white light source having a laminated structure which may include a common anode, luminous layers and a common cathode. The luminous layer may include a plurality of luminous material layers emitting different colors with each other to provide plural luminous regions, and a white light is obtained by color mixing by allowing the plural luminous layers to light by simultaneously applying a voltage to the plural luminous layers.

A white light can be obtained using luminous materials that emit colors other than the white color. Consequently, the EL element can be addressed with a low addressing voltage with a high luminance and reliability. The construction also enables cost-down of the power source unit since white light is emitted using a single addressing power source.

In the organic EL white light source according to another exemplary embodiment in relation to the above-described embodiment of the present invention, the planar configuration of each luminous region corresponding to each of the plural luminous layers is a circle or an ellipsoid.

The luminous layer is more uniformly formed when the luminous material is formed by a coating method, in particular by an ink-jet method when the planar configuration of the luminous region is a circle or an ellipsoid.

In the organic EL white light source according to another exemplary embodiment in relation to the above-described embodiment of the present invention, each luminous region corresponding to each of the plural luminous layers is regularly arranged with a periodic repeating unit.

The luminous colors from respective luminous regions are mixed and emitted as a white color in the arrangement as described above.

In the organic luminous EL white light source according to another exemplary embodiment in relation to the above-described embodiment of the present invention, each luminous region is regularly arranged with a periodic repeating unit along a first direction, and a linear arrangement of luminous regions having the same color is formed along a second direction perpendicular to the first direction.

The luminous colors from respective luminous regions are mixed with each other and the mixed light is emitted as a white color in the arrangement as described above, thereby enabling throughput for forming the luminous layer by an ink-jet method.

In the organic EL white light source according to another exemplary embodiment in relation to the above-described embodiment of the present invention, the area ratio of the luminous region in each luminous layer is adjusted so that a white color is obtained.

A white light is emitted by addressing all the luminous layers with the same voltage in the construction as described above.

In the organic EL white light source according to another exemplary embodiment in relation to the above-described embodiment of the present invention, each luminous layer in the plural luminous layers is addressed so as to minimize the addressing voltage as a sum of consumed electric power of each luminous layer.

The construction as described above allows power consumption of the light source for addressing each luminous layer to be decreased.

In the organic EL white light source according to another exemplary embodiment in relation to the above-described embodiment of the present invention, the plural luminous colors may include two colors.

The process cost for forming each luminous layer is decreased since only two times of deposition steps are required for patterning in the construction as described above.

In the organic EL white light source according to another exemplary embodiment in relation to the above-described embodiment of the present invention, the plural luminous colors may include three colors.

A balanced white light source may be realized by the construction as described above.

In the organic EL white light source according to another exemplary embodiment in relation to the above-described embodiment of the present invention, a light diffusion plate is placed on the luminous surface of the light source.

The shape of each luminous region may be blurred in the construction as described above, thereby enabling a more uniform planar white emission to be obtained.

In the organic EL white light source according to another exemplary embodiment in relation to the above-described embodiment of the present invention, a light diffusing substrate is used for the substrate for the light source.

The construction as described above can eliminate the need of disposing the light diffusion plate as a separate plate, thereby enabling to provide simplicity in structure and to reduce the production cost.

Another exemplary embodiment of the present invention provides an organic electroluminescent white light source having a laminated structure which may include an anodes, luminous layers and a cathode on a substrate, and the plural luminous layers are disposed on the substrate. A plurality of division walls for dividing a plurality of luminous layers are provided on the substrate, and the luminous regions are distributed with a space apart with each other by disposing at least the luminous layer in each divided region. A white light is obtained by allowing each luminous layer to light by simultaneously applying a voltage to the luminous layer in each luminous region.

A white planar light having such characteristics as uniform and stable luminance can be obtained using luminous materials with colors other than a white color in the construction as described above.

The organic EL white light source according to another exemplary embodiment in relation to the above-described embodiment of the present invention may include a common anode for the plural luminous layers.

The organic EL white light source according to another exemplary embodiment in relation to the above-described embodiment of the present invention may include a common cathode for the plural luminous layers.

A stable white light may be obtained using a simple construction as described above.

In the organic EL white light source according to another exemplary embodiment in relation to the above-described embodiments of the present invention, the luminous layer is formed by an ink-jet method.

A uniform luminous layer may be obtained only in a specified region of the luminous layer in the construction as described above, enabling a white light source having good characteristics to be realized.

In the organic EL white light source according to another exemplary embodiment in relation to the above-described embodiment of the present invention, the planar configuration of the luminous region is a circle or an ellipsoid.

A uniform luminous layer may be obtained particularly when the luminous layer is formed using the ink-jet method in the construction as described above.

The organic EL white light source according to another exemplary embodiment in relation to the above-described embodiment may further include an auxiliary electrode provided on the surface of the common anode for enhancing electrical characteristics of the common anode.

Electrical characteristics such as uniform surface potential of the common anode may be enhanced by the construction as described above, thereby reducing irregular light emission.

Another exemplary embodiment of the present invention provides a method for manufacturing an organic EL white light source having a laminated structure which may include a common anode, luminous layers and a common cathode. The luminous layer may include a plurality of luminous material layers emitting different colors with each other. A white light is obtained by color mixing by simultaneously applying a voltage to and lighting the plural luminous layers. The luminous layer corresponding to each of the plural luminous layers emitting each color is formed by an ink-jet method.

The white light source may be readily manufactured with a low manufacturing cost, since no positioning is required in disposing the luminous layers and expensive EL materials are not wasted.

Another exemplary embodiment of the present invention provides a method for manufacturing an organic electroluminescent white light source having a laminated structure which may include a common anode, luminous layers and a common cathode. The luminous layer may include a plurality of luminous material layers emitting different colors with each other, and a white color is obtained by color mixing by simultaneously applying a voltage on and lighting the plural luminous layers. The luminous layer corresponding to each of the plural luminous regions emitting each color is formed by a vacuum deposition method.

The element as described above can emit a white light by providing uniform luminous layers in the white light source.

Another exemplary embodiment of the present invention provides a method for manufacturing an organic electroluminescent white light source having a laminated structure which may include a common anode, luminous layers and a common cathode. The luminous layer may include a plurality of luminous material layers emitting different colors with each other, and a white color is obtained by color mixing by simultaneously applying a voltage on and lighting the plural luminous layers. The luminous layer corresponding to each of the plural luminous layers emitting each color is formed by a printing method.

The present invention provides a process for manufacturing the white light source having good patterns with a low manufacturing cost.

In the method for manufacturing the organic EL white light source according to another exemplary embodiment in relation to the above-described embodiment of the present invention, a plurality of luminous materials having different luminous colors with each other are used in forming the luminous layer and, after coating one kind of a luminous material on the entire surface of a substrate as a host material, other luminous materials are coated as dotted dopant materials on the host material coated on the entire surface of the substrate.

The division walls among the luminous layers may be omitted in the construction as described above.

In the method for manufacturing the organic EL white light source according to another exemplary embodiment in relation to the above-described embodiment of the present invention, plural kinds of luminous materials having different luminous colors with each other are used as the luminous layer on which each kind of luminous materials is coated with no gaps among the luminous materials.

The division walls among the luminous layers may be omitted in the construction as described above.

In the method for manufacturing the organic EL white light source according to another exemplary embodiment in relation to the above-described embodiment, a plural kinds of luminous materials having similar aging characteristics are used for forming the plural luminous layers.

A white light as a synthesized luminous light may be always obtained even when the luminous light changes by aging in the construction as described above.

DETAILED DESCRIPTION OF PREFERRED EMBODIMENTS

Figure 1:
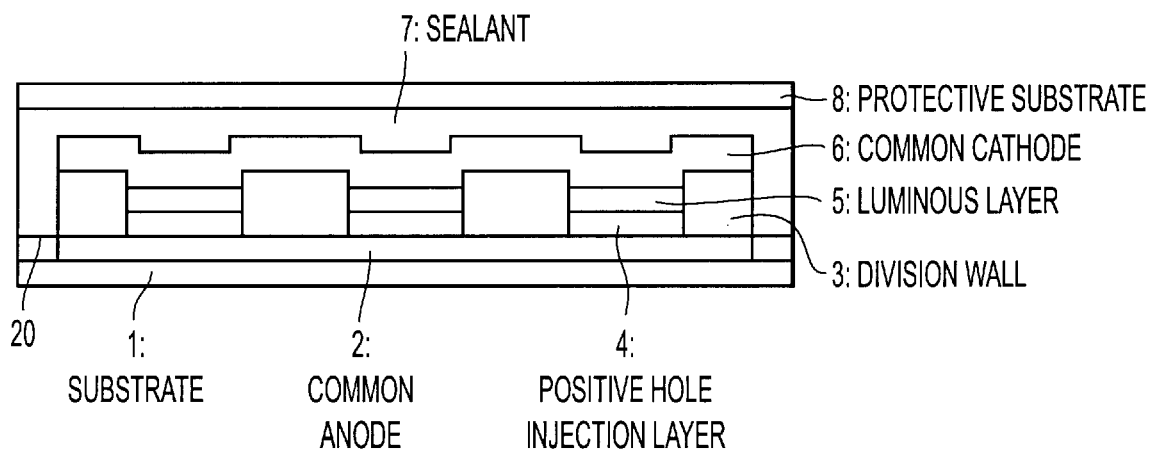
FIG. 1 is a cross section showing the structure of the organic EL white light source in one exemplary embodiment according to the present invention.

Embodiments of the present invention will be described hereinafter with reference to drawings. In the following descriptions, the portions in each drawing identical to those in other drawings are shown by the same reference numerals. The present invention will be described hereinafter in the order of the examples shown.

EXAMPLE 1

The organic EL white light source in this example may include a common anode, luminous layers and a common cathode. The luminous layer may include a plurality of luminous material layers emitting different colors with each other to provide plural luminous regions. A white light is obtained by color mixing by simultaneously applying a voltage to and lighting the plural luminous layers. FIG. 1 shows a cross section of the structure of the organic EL white light source in this example.

In the structure shown in the drawing, a plurality of division walls 3 (with a given pattern in a planar view) are provided on the substrate 1 to divide the substrate into plural regions. A common anode 2 (having a common wiring line and the same potential) is formed as a film that is continuous in the cross section and over the area including the entire regions. A luminous layer 5 including a positive hole injection layer 4 and organic materials is laminated on each region. A common cathode 6 (having a common wiring line and the same potential) is formed on the luminous layers as a film that is continuous in the cross section, and over the area including the entire regions. A protective substrate 8 is additionally provided by being sealed with a sealant 7.

Practically, the common anode 2 including ITO (indium tin oxide) was deposited on the glass substrate 1, and a polyimide resin was patterned as the division walls 3. The total size of the plural luminous regions was 3×4 cm, and the area of each luminous surface corresponding to each luminous layer was 1600 $\mu m^2$. The luminous layers were arranged with a pitch of 70.5 $\mu m$. Baytron made by Bayer Co. was deposited as the positive hole injection layer 4, on which the luminous layers 5 corresponding to different colors were deposited and patterned. Lithium fluoride, calcium and aluminum with a thickness of 2 nm, 20 nm and 200 nm, respectively, were deposited as the common cathode 6 in this order on the luminous layers. The sealant 7 including an epoxy resin was coated on the common cathode, and the protective substrate 8 made of a glass was bonded on the sealant.

When a voltage was applied between the common anode 2 and common cathode 6 of the light source obtained as described above, a white color was observed by mixing of the luminous lights emitted from each luminous layer 5. The luminance of the emitted light showed a good agreement with the luminance calculated from the luminance of each monochromatic light and aperture ratio (the area ratio of the luminous regions relative to the total area of the luminous surface as a backlight). The luminous efficiency also showed a good agreement with the mean value of the luminous efficiencies of each monochromatic light.

A substrate that can permeate the light from the luminous layer, such as a plastic substrate, may be used as well for the substrate 1 or the protective substrate 8, other than the glass substrate. The sizes of the substrate and the luminous region, and the pitch for arranging the luminous regions are not always restricted to the sizes and pitch shown in this example.

A transparent and conductive film such as a NESA film and IDIXO film (made by Idemitsu Industrial Co.) may be used as well for the common anode 2 other than the ITO film. A material capable of patterning other than the polyimide resin described above may be also used for the division walls 3. A pattern of inorganic materials may be obtained by, for example, a mask deposition method or photolithographic method.

An auxiliary electrode 20 may be additionally formed on the surface of the common anode 2, in order to enhance electrical characteristics of the common anode. The auxiliary electrode 20 is provided at the circumferential periphery on the surface of the anode 2 in order to prevent the luminous energy from decreasing. Providing the auxiliary electrode 20 allows the electrical characteristics such as uniform potential on the surface of the anode to be enhanced, thereby alleviating irregular light emission.

It is more preferable to treat the surface of the division wall 3 with a water repellent such as a fluorinated resin when the luminous layer 5 is formed using the ink-jet method. The configuration of the luminous region may be determined by the patterned configuration of the division wall as will be described hereinafter.

Any materials other than BYTRON described above that can be used for the organic EL element may be used for the positive hole injection layer 4, irrespective of their molecular weight. A positive hole transfer layer may be inserted between the positive hole injection layer 4 and the luminous layer 5, if necessary.

An organic luminous material having higher or lower molecular weight that can be used for the organic EL element may be used for the luminous layer 5. The planar configuration of the luminous layer determined by the patterned configuration of the division wall 3 may be various shapes, including a rectangle (a square), a circle or an ellipsoid. The circular or ellipsoidal shape is preferable for depositing the luminous layer by the ink-jet method.

Any cathode materials that can be used for the organic EL element may be used for the cathode 6, other than lithium fluoride, calcium and aluminum.

While an epoxy resin was used for the sealant 7, other materials having a low gas permeability may be used as well. The sealing method other than the method described above may include coating the sealant around the luminous portions (peripheral circumference) to adhere the protective substrate. A deoxydation material or a demoisturing material may be inserted in the space between the protective substrate and cathode.

The configuration of the luminous region and layout (pattern of the luminous region) available include those shown in FIGS. 3 to 15 and FIGS. 18 to 22.

EXAMPLE 2

Figure 2:
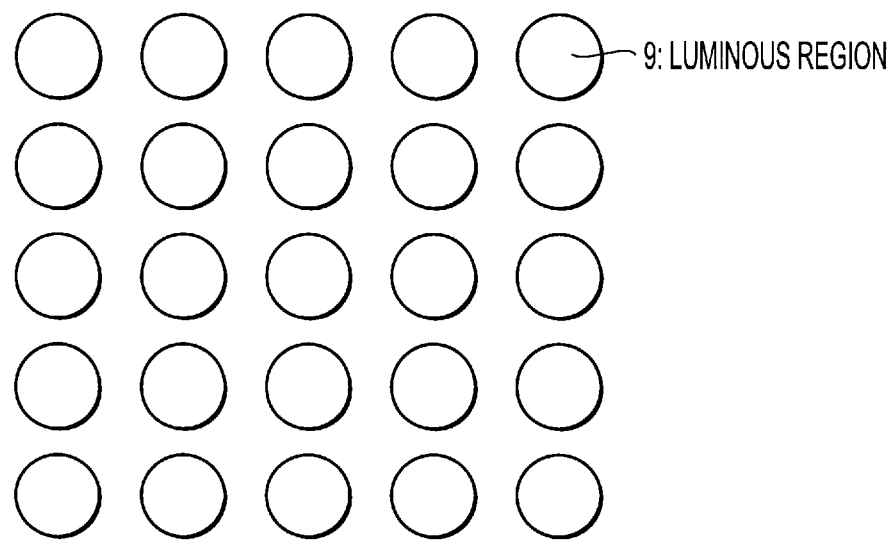
FIG. 2 is a plane view showing an example of the arrangement of the luminous regions of the organic EL white light source in one exemplary embodiment according to the present invention.

The luminous region of the organic EL white light source in this example has a circular or ellipsoidal planar configuration. FIG. 2 shows the arrangement of the organic EL white light source in this example.

The organic EL white light source in this example was manufactured in accordance with the method in Example 1, wherein the division wall 3 was patterned so that the luminous region 9 has a circular or ellipsoidal shape.

The luminous layer 5 was formed by the ink-jet method. A uniform light emission from the luminous region 9 was observed and the overall emission was a uniform white light.

A film with a uniform thickness may be formed particularly by the ink-jet method, when the configuration of the luminous region formed from the luminous layer 5 is a circle or an ellipsoid. The layout of the luminous regions available include those shown in FIGS. 3 to 15.

EXAMPLE 3

Figure 3:
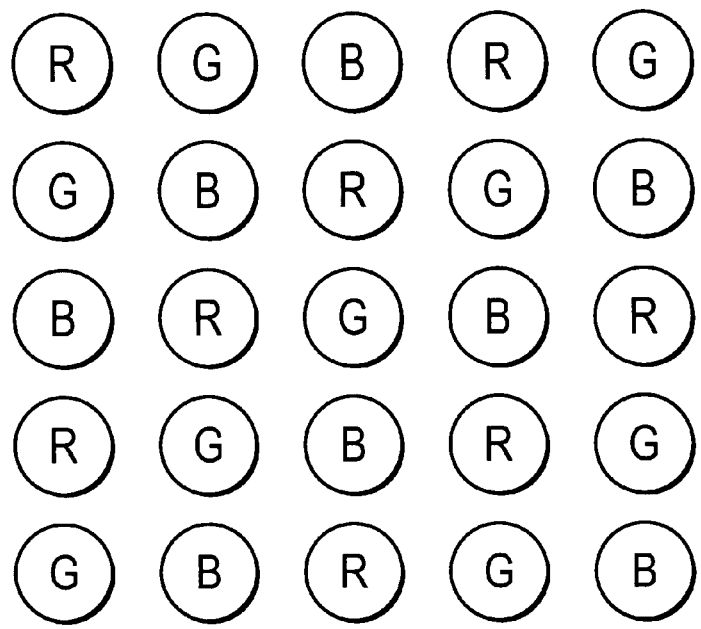
FIG. 3 is a plane view showing an example of the arrangement of the luminous regions of the organic EL white light source applied in one exemplary embodiment according to the present invention.

Each luminous region is regularly aligned with a periodic repeating unit in the organic EL white light source in this example. FIG. 3 shows the arrangement of the luminous regions of the organic EL white light source in this example, wherein three luminous colors (R, G and B) were disposed as a mosaic pattern. The organic EL white light source was manufactured according to the method in Example 1. A pattern of the luminous regions corresponding to the luminous layer as shown in FIG. 3 was obtained by the arrangement (patterned configuration) of the division walls. The luminous layer was patterned by the vacuum deposition method using a mask.

The organic EL white light source manufactured as described above emitted a white light.

With respect to the layout (pattern) of the luminous regions, a uniform white light may be obtained by a regular arrangement of each luminous region with a periodic repeating unit other than the mosaic pattern shown in FIG. 3. For example, various layouts and shapes as shown in FIGS. 4 to 15 and FIGS. 18 to 22 may be used.

Figure 4:
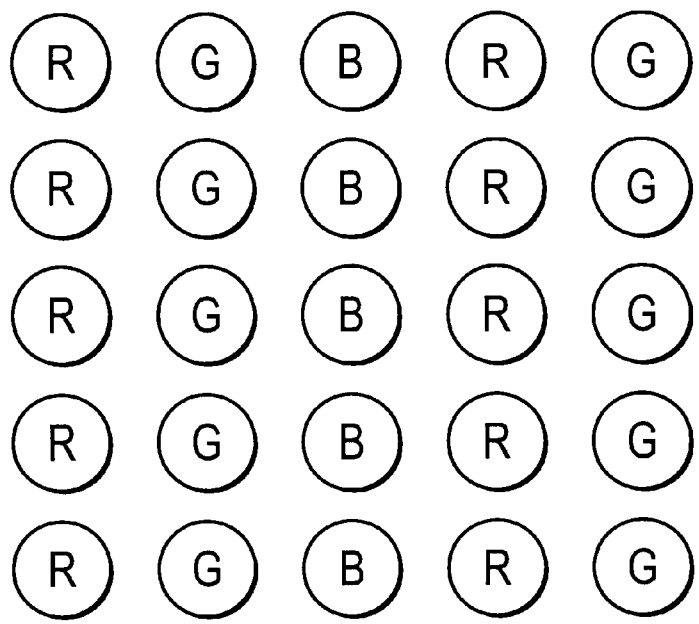
FIG. 4 is a plane view showing an example of the arrangement of the luminous regions of the organic EL white light source applied in one exemplary embodiment according to the present invention.

In FIG. 4, each luminous region is regularly disposed with a periodic repeating unit along the first direction, and the luminous regions having the same color are linearly aligned along the second direction perpendicular to the first direction. Consequently, the center of each luminous region is positioned at the apex of a square.

Figure 5:
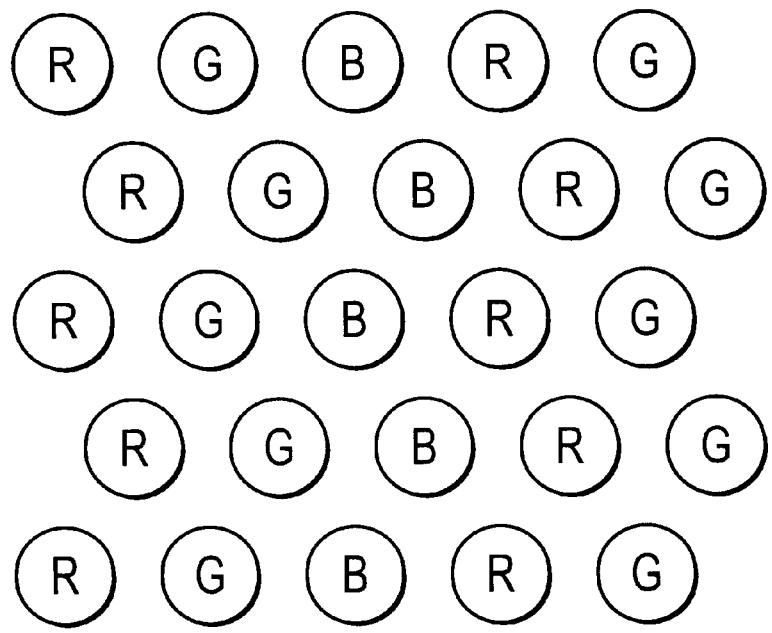
FIG. 5 is a plane view showing an example of the arrangement of the luminous regions of the organic EL white light source applied in one exemplary embodiment according to the present invention.
Figure 6:
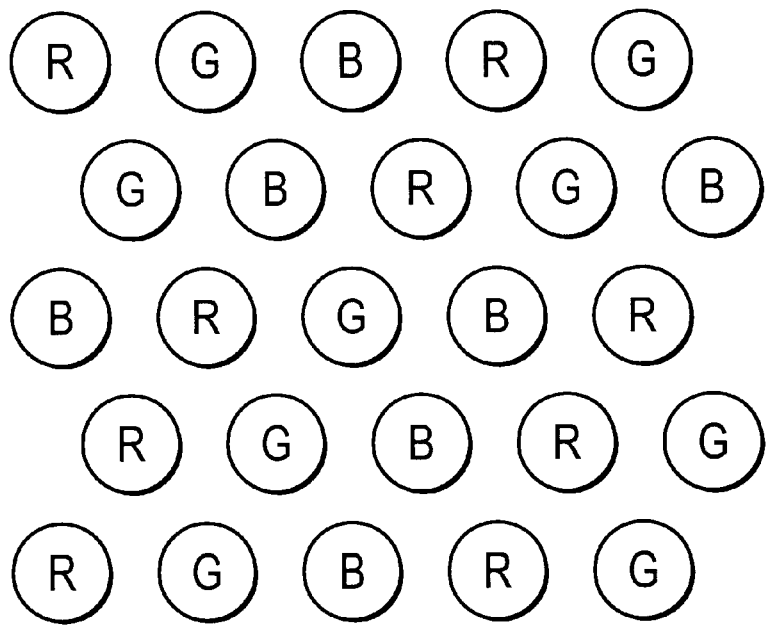
FIG. 6 is a plane view showing an example of the arrangement of the luminous regions of the organic EL white light source applied in one exemplary embodiment according to the present invention.

In FIG. 5, the arrangement shown in FIG. 4 is changed so that the luminous regions having the same color are aligned along crooked lines approximately perpendicular to the regularly aligned first direction with a periodic repeating unit. Consequently, the center of each luminous region is positioned at each apex of an equilateral triangle. Similarly, FIG. 6 shows an arrangement in which the center of each luminous region shown in the arrangement in FIG. 3 is changed so that it is positioned at each apex of a equilateral triangle.

Figure 7:
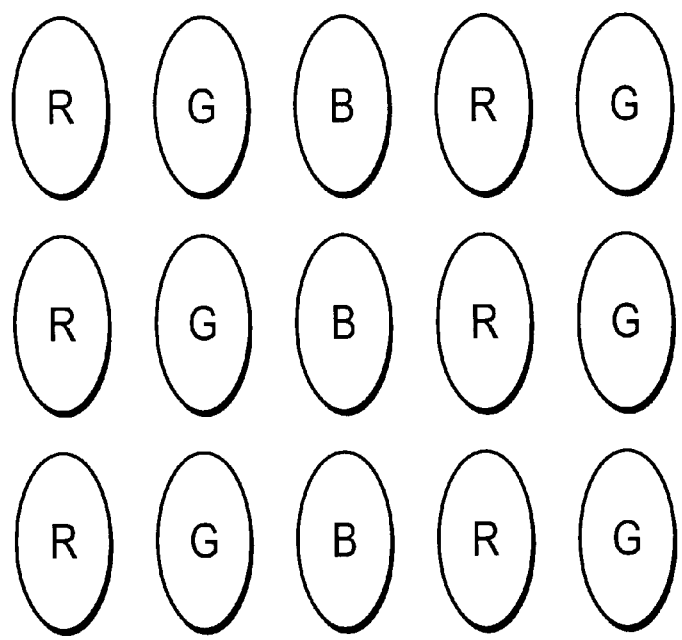
FIG. 7 is a plane view showing an example of the arrangement of the luminous regions of the organic EL white light source applied in one exemplary embodiment according to the present invention.
Figure 8:
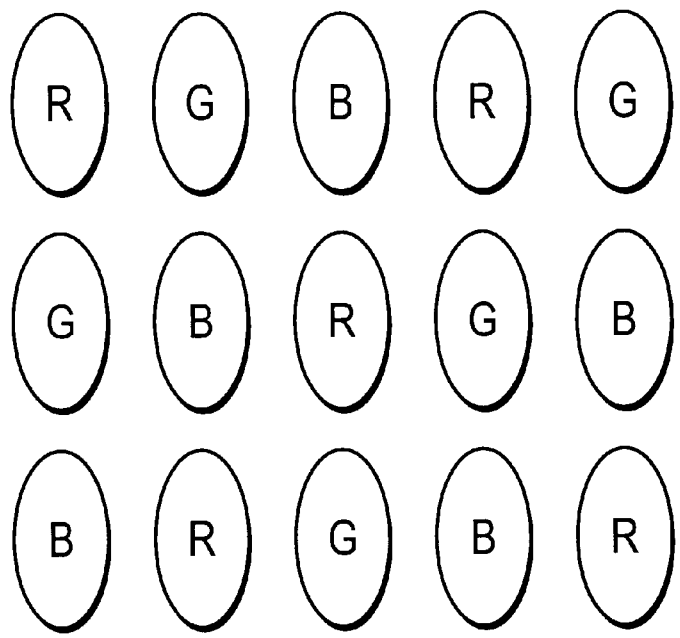
FIG. 8 is a plane view showing an example of the arrangement of the luminous regions of the organic EL white light source applied in one exemplary embodiment according to the present invention.
Figure 9:
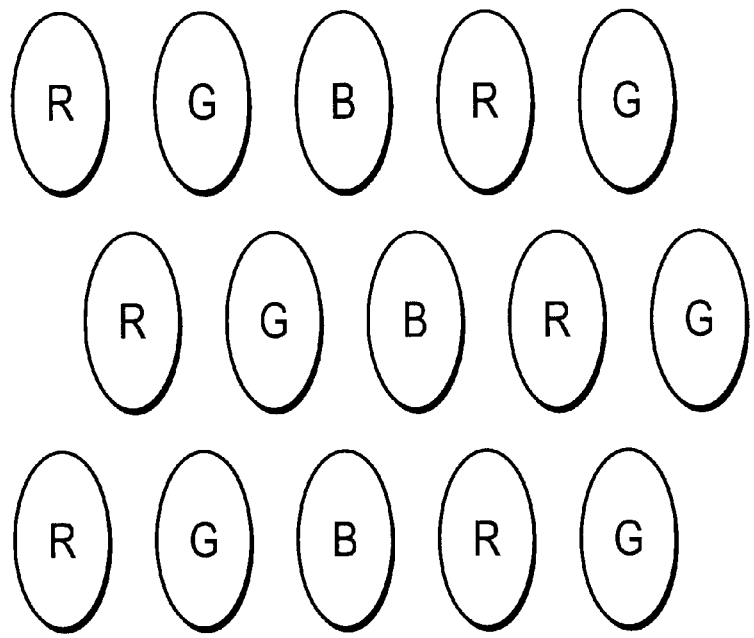
FIG. 9 is a plane view showing an example of the arrangement of the luminous regions of the organic EL white light source applied in one exemplary embodiment according to the present invention.
Figure 10:
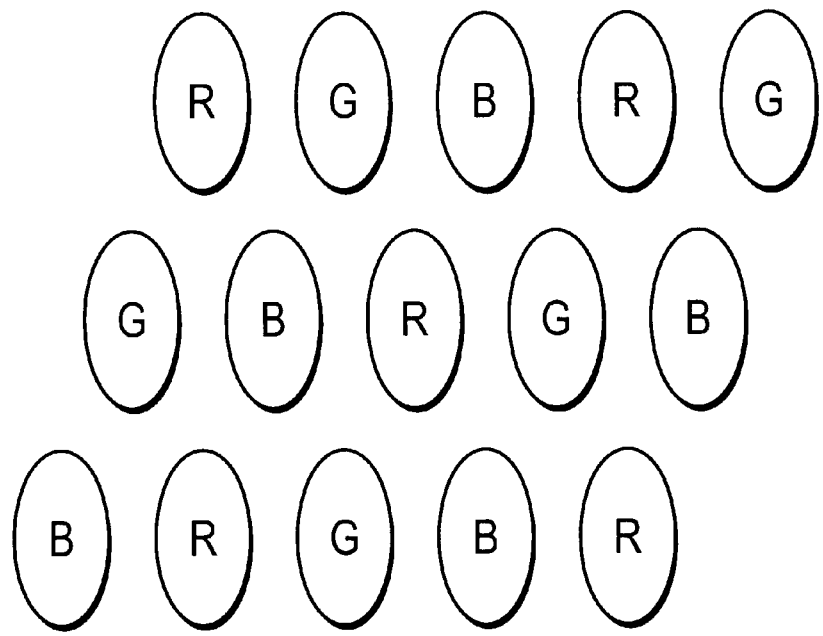
FIG. 10 is a plane view showing an example of the arrangement of the luminous regions of the organic EL white light source applied in one exemplary embodiment according to the present invention.

FIG. 7 shows an arrangement in which the shape of each luminous region shown in the arrangement in FIG. 4 is changed to an ellipsoid. FIG. 8 shows an arrangement in which the shape of each luminous region shown in the arrangement in FIG. 3 is changed to an ellipsoid. FIG. 9 shows an arrangement in which the shape of each luminous region shown in the arrangement in FIG. 5 is changed to an ellipsoid. FIG. 10 shows an arrangement in which the shape of each luminous region shown in the arrangement in FIG. 6 is changed to an ellipsoid.

Figure 19:
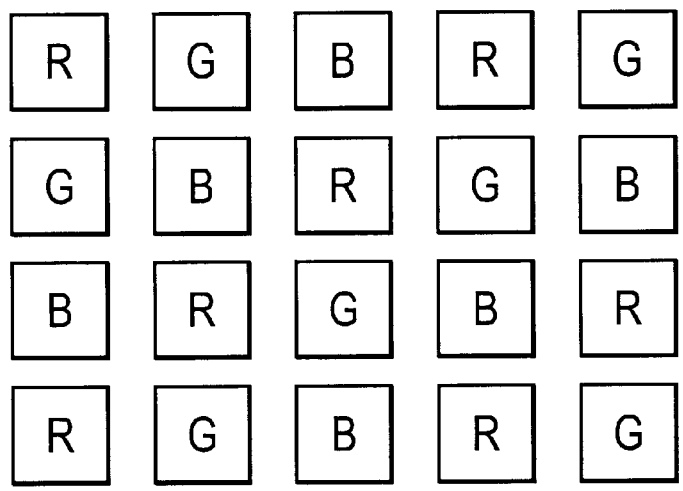
FIG. 19 is a plane view showing an example of the arrangement of the luminous regions of the organic EL white light source applied in one exemplary embodiment according to the present invention.
Figure 20:
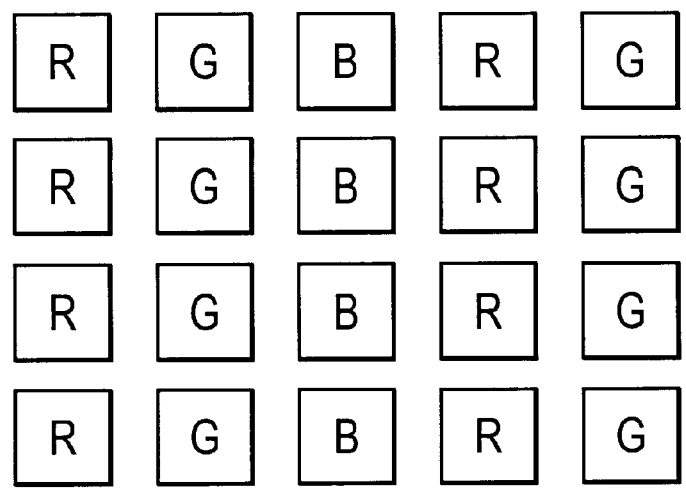
FIG. 20 is a plane view showing an example of the arrangement of the luminous regions of the organic EL white light source applied in one exemplary embodiment according to the present invention.
Figure 21:
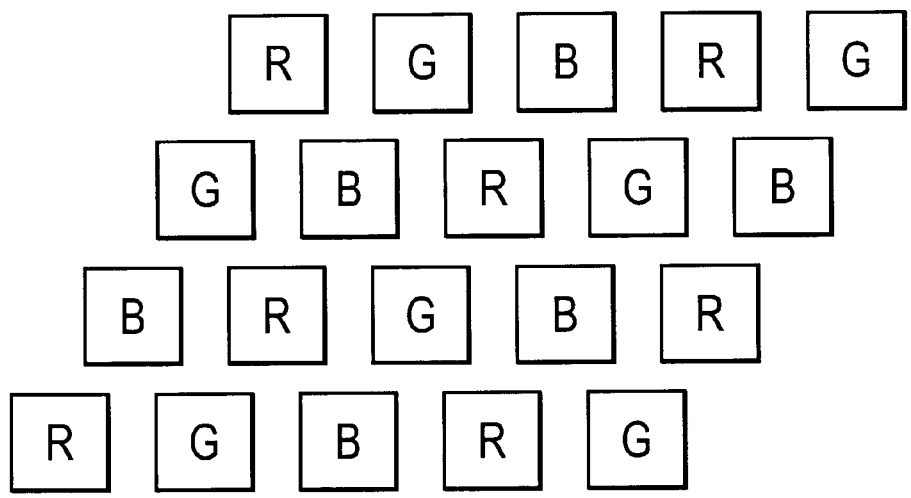
FIG. 21 is a plane view showing an example of the arrangement of the luminous regions of the organic EL white light source applied in one exemplary embodiment according to the present invention.
Figure 22:
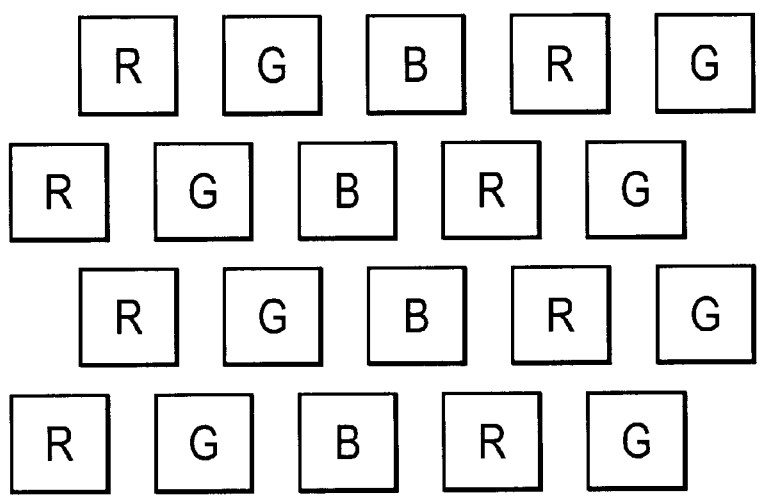
FIG. 22 is a plane view showing an example of the arrangement of the luminous regions of the organic EL white light source applied in one exemplary embodiment according to the present invention.

FIG. 19 shows an arrangement in which the shape of each luminous region shown in the arrangement in FIG. 3 is changed to a rectangle (square). FIG. 20 shows an arrangement in which the shape of each luminous region shown in the arrangement in FIG. 4 is changed to a rectangle (square). FIG. 22 shows an arrangement in which the shape of each luminous region shown in the arrangement in FIG. 5 is changed to a rectangle (square). FIG. 21 shows an arrangement in which the shape of each luminous region shown in the arrangement in FIG. 6 is changed to a rectangle (square).

EXAMPLE 4

Each luminous region is regularly arranged along one direction with a periodic repeating unit corresponding to the arrangement of the luminous layers, lines of the luminous regions emitting the same color are formed along the direction perpendicular to the direction above in the organic EL white light source in this example. FIG. 4 shows the arrangement of the organic EL white light source in this example. Three colors of R, G and B are emitted in this example. The organic EL white light source was manufactured according to the method in Example 1. The division walls 3 were formed so that the arrangement of the luminous layers (the arrangement of the luminous regions) as shown in FIG. 4 could be obtained. The luminous layers were patterned by the ink-jet method.

The organic EL white light source manufactured as described above emitted a uniform white light. The colors of the inks were not mixed by deposition using, in particular, the ink-jet method, enabling a uniform pattern to be formed.

Other layouts (patterns) of the luminous regions as shown in FIGS. 4, 7, 11, 13, 18 and 20 are available with different arrangements and configurations.

EXAMPLE 5

The area ratio of each color in each luminous region is adjusted so as to be able to obtain a white light in the organic EL white light source in this example.

A red material R1 that exhibits a maximum efficiency at 6V was used as a luminous material. The luminance (generally represented as Lr) was 300 Cd/m$^2$. A green material G1 showed a luminance (generally represented as Lg) of 1200 Cd/m$^2$, and a blue material B1 showed a luminance (generally represented as Lb) of 1300 Cd/m$^2$ at a commonly applied voltage of 6V. Since a luminance ratio of Red:Green:Blue=3:6:1 (generally represented as Lwr:Lwg:Lwb) is necessary for the white balance, the luminous area of the green light is designed to be ½ of the luminous area of the red light [generally represented as (Lr/Lg)×(Lwg/Lwr)], and the luminous area of the blue light is designed to be ⅓ of the luminous area of the red light [generally represented as (Lr/Lb)×(Lwb/Lwr)]. Accordingly, the luminous area ratio among each color is represented as Red:Green:Blue (generally represented as Sr:Sg:Sb)=6:3:2. The overall luminance is calculated as (6/11)×300+(3/11)×1200+(2/11)×300=545 Cd/m$^2$, and a luminance of 218 Cd/m$^2$ was obtained by multiplying the total aperture ratio of 40% (generally represented as α%). A chromaticity of (0.31, 0.31) was obtained.

As a general expression, the luminous area ratio is expressed as Sr:Sg:Sb=1: (Lr/Lg)×(Lwg/Lwr):(Lr/Lb)×(Lr/Lb)×(Lwb/Lwr), and the overall luminance is expressed as Lw=LrLgLb×(Lwr+Lwg+Lwb)/(LwrLgLb+LwgLrLb+LwbLrLg)×α/100.

EXAMPLE 6

Each luminous layer is addressed by an addressing voltage so that the sum of the consumed power of each luminous layer is minimized in the organic EL white light source in this example.

With reference to Example 5, the power consumption is represented by Px(W)=πLxSx/Ex (Lx represents the luminance Cd/m$^2$, Sx represents the luminous area m$^2$, and Ex represents the luminous efficiency 1 m/W, x being r, g or b). Accordingly, the total power consumption is represented by π(LrSr/Ex+LgSg/Eg+LbSb/Eb). The addressing voltage for minimizing P can be determined when the product of the luminance and luminous efficiency is determined as a function of the addressing voltage. The aperture ratio was adjusted in order to obtain a desired luminance.

EXAMPLE 7

Figure 11:
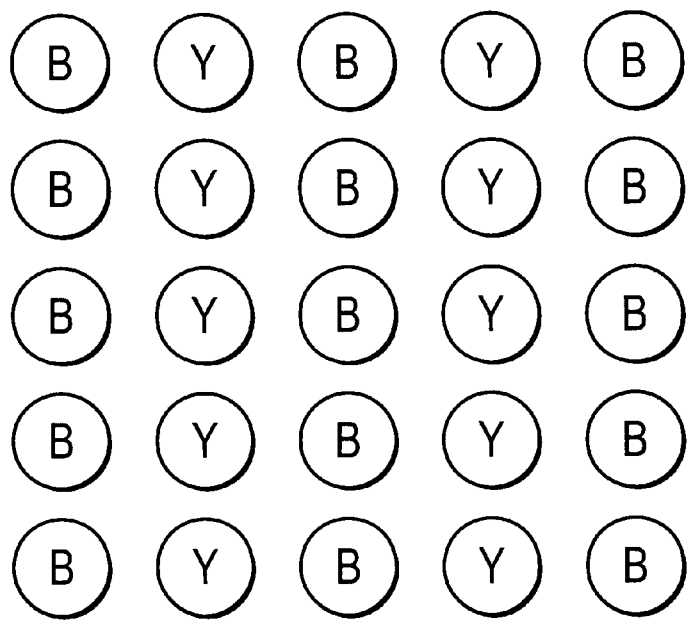
FIG. 11 is a plane view showing an example of the arrangement of the luminous regions of the organic EL white light source applied in one exemplary embodiment according to the present invention.

Two luminous colors are used as the plural luminous colors in the organic EL white light source in this example. FIG. 11 shows the layout of the luminous regions corresponding to the luminous layers of this example. A white light was emitted using the two colors of blue (B) and yellow (Y).

The element was manufactured by the same procedure as in Example 1. The blue luminous material was the same as used in example 1, and the yellow luminous material was a material called Y1. These materials were formed by the ink-jet method.

A uniform white color was obtained by lighting the manufactured element. The chromaticity was (0.33, 0.35).

The term related to the green color in Examples 5 and 6 may be omitted, and the term related to the red color may be replaced by the yellow color (y) for calculating the area ratio of the luminous areas in this example.

The layout (pattern) of the luminous regions shown in FIGS. 12 to 15 may be also used in this example.

Figure 12:
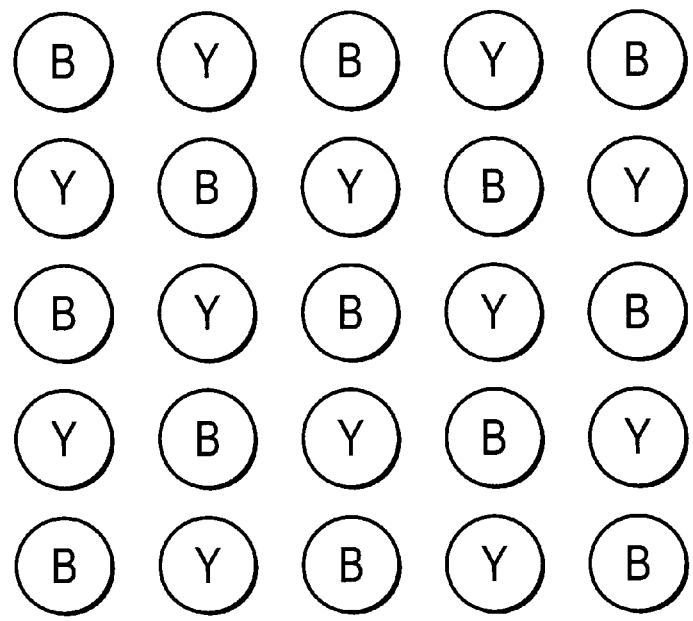
FIG. 12 is a plane view showing an example of the arrangement of the luminous regions of the organic EL white light source applied in one exemplary embodiment according to the present invention.

In FIG. 12, both luminous regions of blue (B) and yellow (Y) are alternately aligned along the first direction and the second direction perpendicular to the first direction, respectively.

Figure 13:
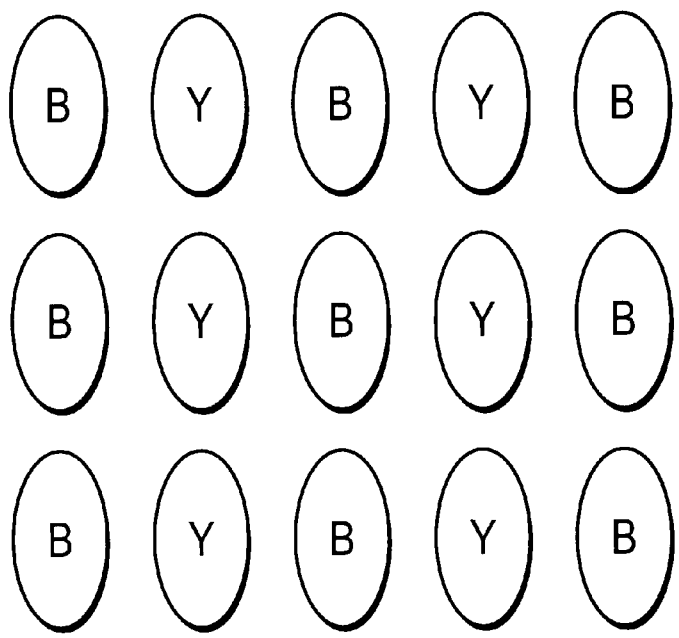
FIG. 13 is a plane view showing an example of the arrangement of the luminous regions of the organic EL white light source applied in one exemplary embodiment according to the present invention.
Figure 14:
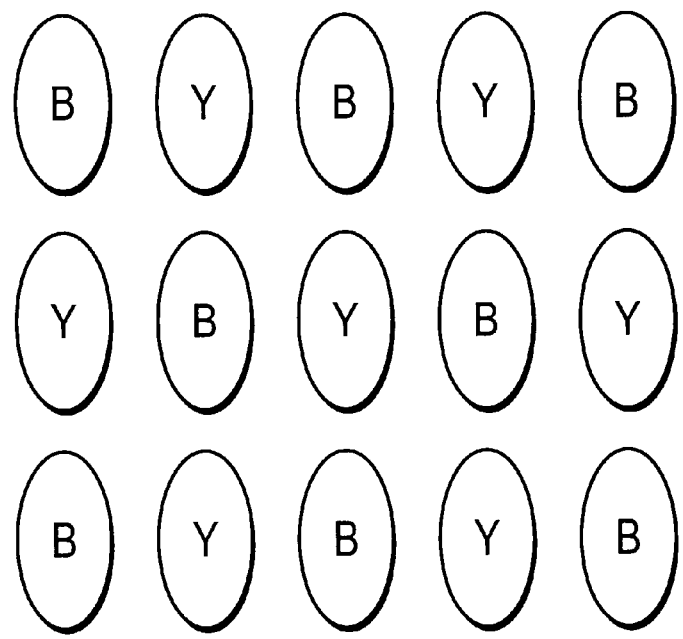
FIG. 14 is a plane view showing an example of the arrangement of the luminous regions of the organic EL white light source applied in one exemplary embodiment according to the present invention.

The shape of each luminous region in the arrangement shown in FIG. 11 is changed to an ellipsoid in the arrangement shown in FIG. 13. The shape of each luminous region in the arrangement shown in FIG. 12 is changed to an ellipsoid in the arrangement shown in FIG. 14.

Figure 15:
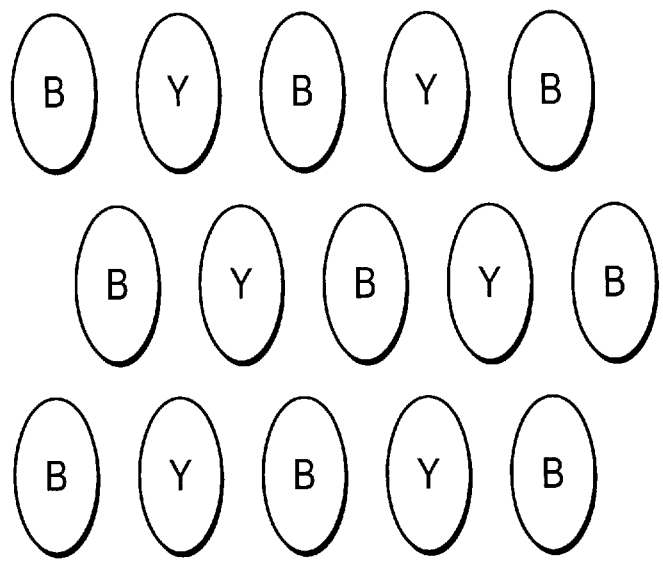
FIG. 15 is a plane view showing an example of the arrangement of the luminous regions of the organic EL white light source applied in one exemplary embodiment according to the present invention.

In FIG. 15, the arrangement shown in FIG. 13 is changed so that the luminous regions having the same color are aligned along crooked lines approximately perpendicular to the regularly aligned first direction with a periodic repeating unit.

EXAMPLE 8

Figure 16:
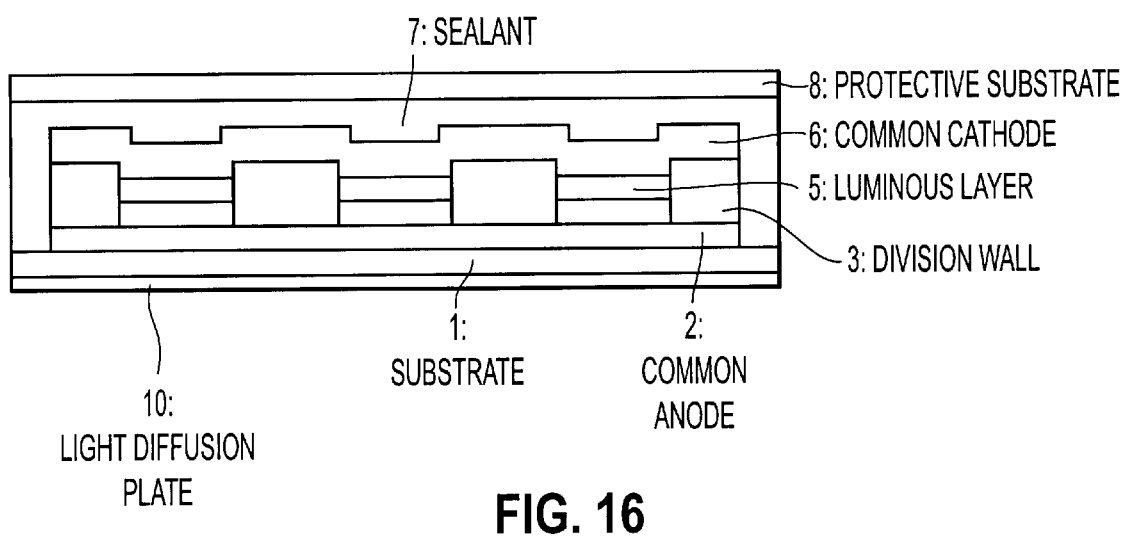
FIG. 16 is a cross section showing the structure of the organic EL white light source in another exemplary embodiment according to the present invention.

A light diffusion plate is placed on the luminous surface of the organic EL white light source (backlight) in this example. FIG. 16 shows a cross-sectional structure of the organic EL white light source in this example. Although the basic structure is the same as that in Example 1 shown in FIG. 1, a light diffusion plate 10 was bonded on the outside of the substrate 1 manufactured in Example. 1. This construction allows the shape of the luminous region corresponding to each luminous layer to be blurred to obtain a uniform luminous surface emitting a white light. Irregular light emission may be also alleviated in this construction by providing an auxiliary electrode for enhancing electrical characteristics of the anode 2.

EXAMPLE 9

Figure 17:
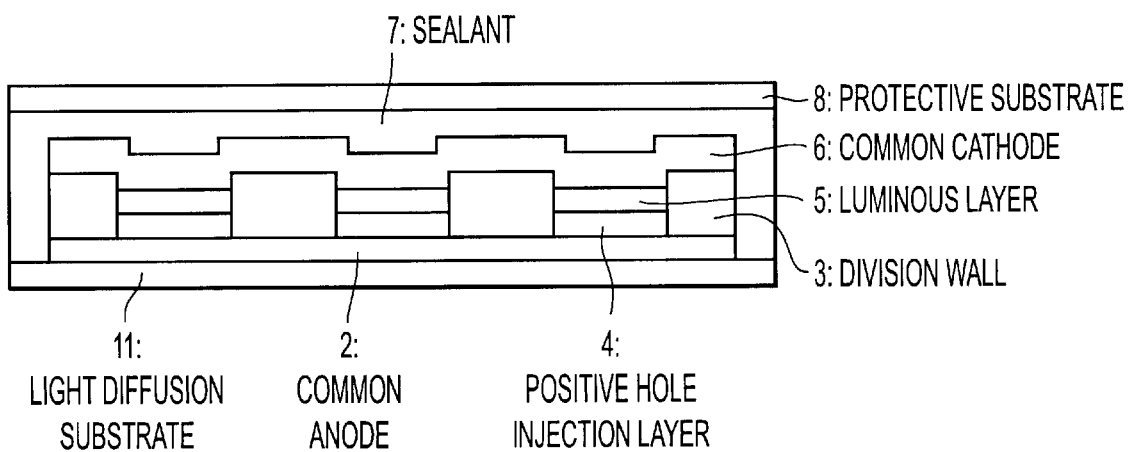
FIG. 17 is a cross section showing the structure of the organic EL white light source in another exemplary embodiment according to the present invention.

A light diffusion substrate is used as the substrate for the organic EL white light source in this example. FIG. 17 shows a cross-sectional structure of the organic EL white light source in this example. The element having the same structure as shown in FIG. 1 in Example 1 was manufactured in accordance with the method in Example 1. A light diffusing substrate 11 was used for the substrate for forming the luminous layer. This construction allows the luminous region corresponding to each luminous layer to be blurred to obtain a uniform luminous surface emitting a white light. Irregular light emission may be also alleviated in this construction by providing an auxiliary electrode for enhancing electrical characteristics of the anode 2.

EXAMPLE 10

This example describes a method for manufacturing an organic EL white light source having a laminated structure which may include a common anode, luminous layers and a common cathode. The luminous layer may include a plurality of luminous material layers emitting different colors with each other, and a white light is obtained by mixing the colors emitted by simultaneously applying a voltage to and lighting the plural luminous layers. The luminous layer corresponding to each of the plural luminous layers emitting each color is formed by an ink-jet method. The cross sectional structure of the organic EL white light source obtained in this example has the structure shown in FIG. 1.

Practically, a common anode 2 including ITO was deposited on a glass substrate, followed by patterning a polyimide resin to form division walls 3. The total size of the luminous surface of the luminous regions was 3×4 cm, the area of each luminous region corresponding to each luminous layer was 1600 $\mu m^2$, and the luminous regions were arranged with a pitch of 70.5 $\mu m$. The luminous layers were arranged in a pattern as shown in FIG. 4. An oxygen plasma was then irradiated on the polyimide division walls, which was further treated with a $CF_4$ plasma to make the surface of the division wall water-repellent. A positive hole injection layer 4 was formed by an ink-jet method using Baytron made by Bayer Co., and the luminous layers 5 corresponding to different colors with each other was formed on the positive hole injection layer 4 by patterning, using the ink-jet method. Lithium fluoride, calcium and aluminum with a thickness of 2 nm, 20 nm and 200 nm, respectively, were deposited in this order as a common cathode. Finally, a sealant 7 including an epoxy resin was coated and then a glass protective substrate 8 was bonded on the common cathode.

When a voltage was applied between the common anode and common cathode of the light source manufactured as described above, the emitted colors from each luminous layer were mixed together, and a white light was observed. The total luminance showed a good agreement with the luminance calculated by multiplying each monochromatic luminance with the aperture ratio (the area ratio of the luminous regions to the total area of the luminous surface as a light source). The luminous efficiency also showed a good agreement with the mean luminance of each monochromatic luminous efficiency.

The positive hole injection layer 4 may be also formed by a printing method or a immersion and pull-up method other than the ink-jet method.

The configurations (patterns) of the luminous layer regions shown in FIGS. 3 to 15 and FIGS. 18 to 22 are available other than the pattern shown in FIG. 4.

EXAMPLE 11

This example describes a method for manufacturing an organic EL white light source having a laminated structure which may include a common anode, luminous layers and a common cathode. The luminous layer may include a plurality of luminous material layers emitting different colors with each other, and a white light is obtained by mixing the colors emitted by simultaneously applying a voltage to and lighting the plural luminous layers. The luminous layer corresponding to each of the plural luminous layers emitting each color is formed by a vacuum deposition method. The organic EL white light source obtained in this example has a cross sectional structure shown in FIG. 1.

Practically, a common anode 2 including ITO was deposited on a glass substrate, followed by patterning a polyimide resin to form division walls 3. The total size of the luminous surface of the luminous regions was 3×4 cm, the area of each luminous region corresponding to each luminous layer was 1600 $\mu m^2$, and the luminous regions were arranged with a pitch of 70.5 $\mu m$. The luminous layers were arranged in a pattern as shown in FIG. 4. A positive hole injection layer 4 was formed using TPD that is commonly used in the vacuum deposition method, and the luminous layers 5 corresponding to different colors with each other was deposited on the positive hole injection layer 4 with patterning. Lithium fluoride, calcium and aluminum with a thickness of 2 nm, 20 nm and 200 nm, respectively, were deposited in this order as a common cathode 6. Finally, a sealant 7 including an epoxy resin was coated, and then, a glass protective substrate 8 was bonded on the common cathode.

When a voltage was applied between the common anode and common cathode of the light source manufactured as described above, the emitted colors from each luminous layer were mixed together and a white light was observed. The total luminance showed a good agreement with the luminance calculated by multiplying each monochromatic luminance with the aperture ratio (the area ratio of the luminous regions to the total area of the luminous surface as a light source). The luminous efficiency also showed a good agreement with the mean value of each monochromatic luminous efficiency.

The positive hole injection layer 4 may be also formed by a printing method or a immersion and pull-up method other than the ink-jet method.

The configurations (patterns) of the luminous layer regions shown in FIGS. 3 to 15 and FIGS. 18 to 22 are available other than the pattern shown in FIG. 4.

EXAMPLE 12

This example describes a method for manufacturing an organic EL white light source having a laminated structure which may include a common anode, luminous layers and a common cathode. The luminous layer may include a plurality of luminous material layers emitting different colors with each other, and a white light is obtained by mixing the colors emitted by simultaneously applying a voltage to and lighting the plural luminous layers. The luminous layer corresponding to each of the plural luminous layers emitting each color is formed by a printing method. The organic EL white light source obtained in this example has a cross sectional structure shown in FIG. 1.

Figure 18:
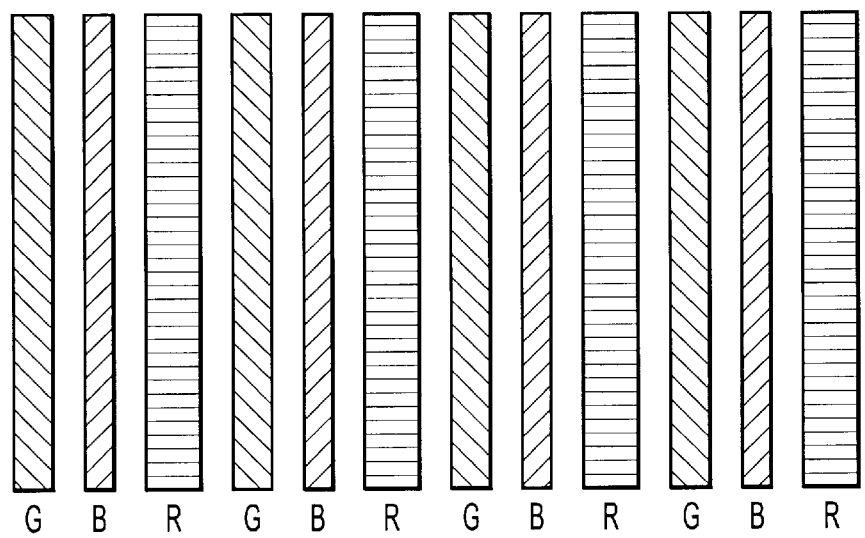
FIG. 18 is a plane view showing an example of the arrangement of the luminous regions of the organic EL white light source applied in one exemplary embodiment according to the present invention.

Practically, a common anode 2 including ITO was deposited on a glass substrate, followed by patterning a polyimide resin to form division walls 3. The total size of the luminous surface of the luminous regions was 16×12 cm, and the luminous regions were arranged with a pitch of 200 μm. The luminous layers were arranged in a striped pattern as shown in FIG. 18. An oxygen plasma was then irradiated on the polyimide division walls, which was further treated with a $CF_4$ plasma to make the surface of the division wall water-repellent. A positive hole injection layer 4 was formed by a spin-coat method using Baytron made by Bayer Co., and the positive hole injection layer 4 was formed only on the cathode 2 including ITO. Then, the luminous layers 5 having different colors with each other were deposited and patterned on the positive hole injection layer 4 by a screen-printing method. Lithium fluoride, calcium and aluminum with a thickness of 2 nm, 20 nm and 200 nm, respectively, were deposited in this order as a common cathode 6. Finally, a sealant 7 including an epoxy resin was coated and then a glass protective substrate 8 was bonded on the common cathode.

When a voltage was applied between the common anode and common cathode of the light source manufactured as described above, the emitted colors from each luminous layer were mixed together and a white light was observed. The total luminance showed a good agreement with the luminance calculated by multiplying each monochromatic luminance with the aperture ratio (the area ratio of the luminous regions to the total area of the luminous surface as a light source). The luminous efficiency also showed a good agreement with the mean luminance of each monochromatic luminous efficiency.

The positive hole injection layer 4 may be also formed by a printing method or a immersion and pull-up method other than the spin-coat method.

The configurations (patterns) of the luminous layer regions shown in FIGS. 3 to 15 and FIGS. 19 to 22 are available other than the pattern shown in FIG. 18.

The white light source obtained in the foregoing examples may be favorably used for the backlight of the liquid crystal display device by providing the light source, for example, on the back face of the liquid crystal panel to irradiate the panel.

The division walls 3 (see FIG. 1) are provided in the foregoing examples. These division walls 3 are required when the luminous layers 5 are formed using an ink-jet method. Accordingly, the division walls 3 are not needed when the luminous layers 5 are deposited with patterning by a printing or vacuum deposition method other than the printing method. However, the division walls 3 may be eliminated when the luminous layers are formed as follows, even by using the ink-jet method.

Figure 23A:
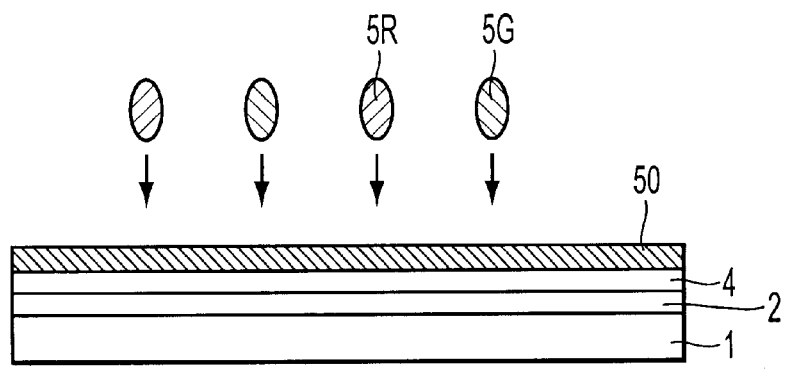
FIGS. 23(a) to 23(c) show a process diagram illustrating the method for manufacturing the organic EL white light source applied in one exemplary embodiment according to the present invention.

After forming a common electrode 2 on the substrate 1 using ITO and a positive hole injection layer 4 as shown in FIG. 23(a), a blue host layer 50 is formed over the entire surface of the positive hole injection layer 4. This blue host layer 50 is formed by coating a blue luminous material by a spin-coat method. Then, a dopant material is coated on the blue host layer 50 by an ink-jet method. A dopant material 5R emitting a red color and a dopant material 5G emitting a green color are used in this example. The coated dopant materials are thoroughly mixed with the blue host material, and are dried.

Figure 23B:
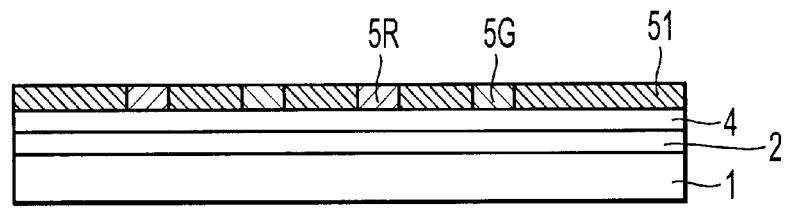
Figure 23C:
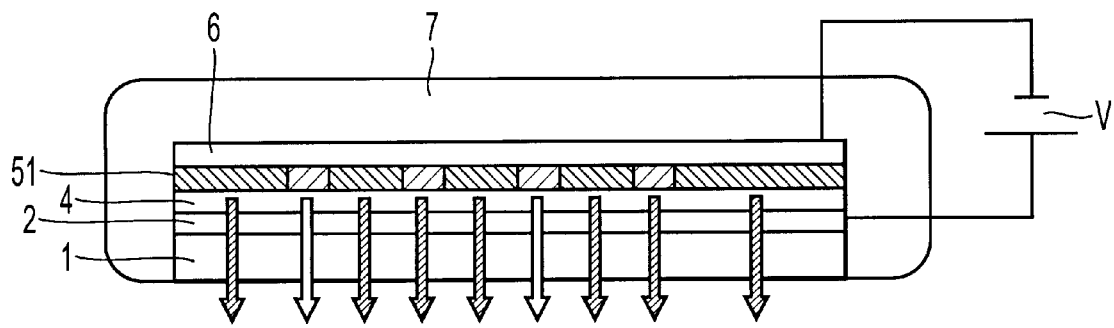

The dopant materials 5R and 5G are completely dissolved into the host material as shown in FIG. 23(b). After forming the luminous layer 51, a common electrode 6 is formed on the luminous layer and the element is sealed with a sealant 7 as shown in FIG. 1. The sealed element is shown in FIG. 23(c). A protective substrate 8 may be provided on the sealant 7 as in FIG. 4.

The luminous layer 5 lights when a voltage V is applied between the common anode 2 and common cathode 6. The area of the luminous layer 51 coated with the each dopant emits a green or red light. The area of the luminous layer 51 not coated with the dopant simultaneously emits a blue light. As a result, the emitted red, blue and green lights are mixed together to emit a white light from the entire light source.

A shunt is not formed between the common anode 2 and common cathode 6 by omitting the division walls, since the blue luminous layer does not cover the entire electrode surface in the structure as shown in FIG. 23(c).

EXAMPLE 14

Figure 24A:
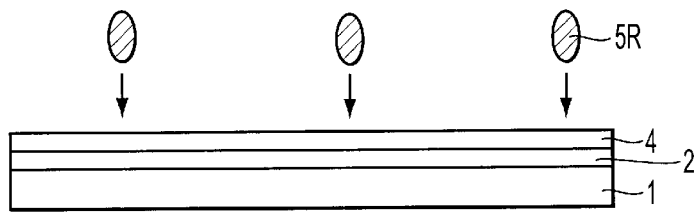
FIGS. 24(a) to 24(e) show a process diagram illustrating the method for manufacturing the organic EL white light source applied in one exemplary embodiment according to the present invention.
Figure 24B:
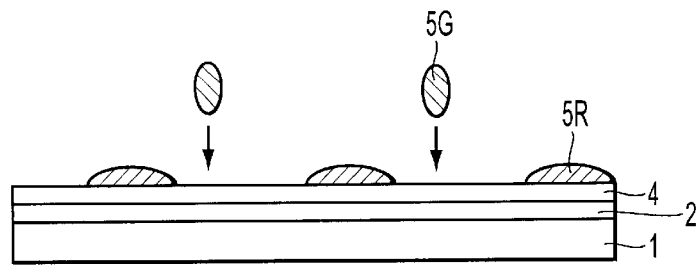
Figure 24C:
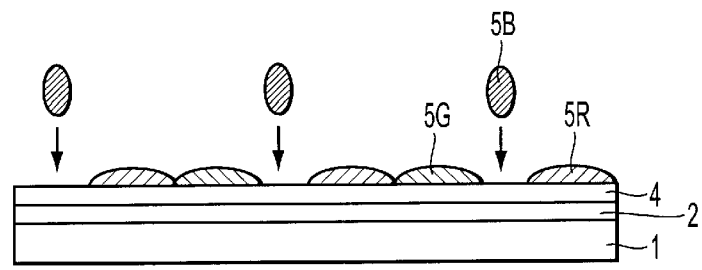
Figure 24D:
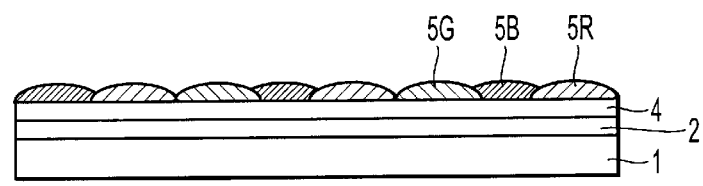

The division walls 3 can be also omitted by using a structure as shown in FIGS. 24(a)–(e). As shown in FIG. 24(a), a common anode 2 and a positive hole injection layer 4 are formed on a substrate 1. Then, a red luminous material 5R is coated with a given space apart as shown in FIG. 24(a), forming coating layers of the red luminous material 5R as shown in FIG. 24(b). Next, a green luminous material 5G is coated with a given space apart, forming coating layers of the green luminous material 5R as shown in FIG. 24(c). Finally, a blue luminous material 5B is coated with a given space apart, forming coating layers of the green luminous material 5R as shown in FIG. 24(d). The luminous materials 5R, 5G and 5B are directly coated on the positive hole injection layer 4 with no gaps among them. The dimensions (diameter) of the luminous materials are 40 μm, 30 μm and 50 μm for the red, green and blue luminous materials 5R, 5G and 5B, respectively. The dimensions as described above allows a white balance for emitting a white light.

Figure 24E:
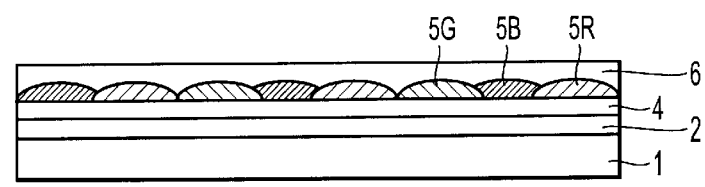

As shown in FIG. 24(e), a common cathode 6 is formed on the luminous materials 5R, 5G and 5B that have been coated with no gaps among them. A light source is completed by sealing the element with a sealant 7 and providing a protective substrate, if necessary, as shown in FIG. 23(c). Red, green and blue lights emit by applying a voltage between the common anode 2 and common cathode 6.

As have been described in FIGS. 23(a)–(c) and 24(a)–(e), a sufficient insulation property can be assured by using lithium fluoride as a common cathode 6 that also serves as a positive hole block layer, even when the division walls as shown in the structure in FIG. 1 have been omitted for constructing the light source. A common cathode 6 made of lithium fluoride on which calcium and aluminum are laminated may be also used.

A white light is obtained by synthesizing the red, green and blue lights in the foregoing examples. Accordingly, although a correct white light is obtained at the time when the light source is manufactured, the synthesized light may display a different color other than the correct white color due to time-dependent changes such as degradation of the luminous colors. For alleviating the time-dependent changes of the luminous colors, materials having similar aging properties may be used for the red, green and blue luminous materials, because a white light can be always obtained as a synthesized luminous color by using the materials having similar aging characteristics even when the luminous color changes by aging.

A thin and light-weight organic EL white light source can be manufactured according to the present invention as hitherto described in detail. The light source emits a balanced white light with a very small power consumption by applying a single addressing voltage. Compact and light-weight portable appliances such as a portable phone, digital camera and video camera that consume a small amount of electric power can be manufactured particularly by using this light source for the backlight.

What is claimed is:

1. An organic electroluminescent device having a laminated structure that causes light emission, comprising:
    a common anode;
    a common cathode; and
    a plurality of luminous layers sandwiched between said common anode and said common cathode, said luminous layers emitting different colors, and grouped to define a plurality of luminous regions,
    wherein said common anode and said common cathode are arranged to activate all of said luminous regions by applying a voltage to said luminous layers, thereby emitting a light collectively mixed thereof.

2. The organic electroluminescent white light source according to claim 1, wherein a planar configuration of each luminous region corresponding to each of the luminous layers being one of a circle and an ellipsoid.

3. The organic electroluminescent white light source according to claim 1, wherein each luminous region corresponding to each of the luminous layers being regularly arranged with a periodic repeating unit.

4. The organic electroluminescent white light source according to claim 3, wherein each luminous region being regularly arranged with a periodic repeating unit along a first direction, and a linear arrangement of said luminous regions aligning like colors and being formed along a second direction perpendicular to the first direction.

5. The organic electroluminescent white light source according to claim 1, wherein an area ratio of the luminous region in each luminous layer being adjusted so that a white color is obtained.

6. The organic electroluminescent white light source according to claim 1, wherein each luminous layer in the plurality of luminous layers being addressed so as to minimize an addressing voltage as a sum of consumed electric power of each luminous layer.

7. The organic electroluminescent white light source according to claim 1, wherein the different colors comprise two colors.

8. The organic electroluminescent white light source according to claim 1, wherein the different colors comprise three colors.

9. The organic electroluminescent white light source according to claim 1, further comprising a light diffusion plate placed on a luminous surface of the light source.

10. The organic electroluminescent white light source according to claim 1, further comprising a light diffusing substrate disposed under said common anode.

11. An organic electroluminescent device having a laminated structure on a substrate that causes light emission, comprising:
    a substrate;
    an anode disposed above said substrate;
    a cathode disposed above said substrate;
    a plurality of luminous layers sandwiched between said anode and said cathode, said luminous layers defining luminous regions; and
    a plurality of division walls dividing said luminous layers, wherein said luminous regions being spaced apart with each other by disposing at least one of said luminous layers in each of said luminous regions, and said anode and said cathode are arranged to activate all of said luminous layers by applying a voltage to said luminous layers in each of said luminous regions, thereby emitting a light collectively mixed thereof.

12. The organic electroluminescent white light source according to claim 11, wherein said anode is a common anode disposed under said luminous layers.

13. The organic electroluminescent white light source according to claim 11, wherein said cathode is a common cathode disposed above said luminous layers.

14. The organic electroluminescent white light source according to claim 11, wherein said luminous layers being formed by an ink-jet method.

15. The organic electroluminescent white light source according to claim 11, wherein a planar configuration of said luminous regions being a circle or an ellipsoid.

16. The organic electroluminescent white light source according to claim 12, further comprising an auxiliary electrode provided on a surface of the common anode for enhancing electrical characteristics of the common anode.

17. A liquid crystal display device, comprising:
    a liquid crystal panel; and
    a light source to illuminate the panel, the light source including the organic electroluminescent white light source according to claim 1.

18. A liquid crystal display device, comprising:
    a liquid crystal panel; and
    a light source to illuminate the panel, the light source including the organic electroluminescent white light source according to claim 11.

* * * * *